United States Patent
Ngion et al.

(10) Patent No.: US 9,209,144 B1
(45) Date of Patent: Dec. 8, 2015

(54) SUBSTRATE WITH ELECTRICALLY ISOLATED BOND PADS

(71) Applicants: Lee Fee Ngion, Melaka (MY); Zi Song Poh, Melaka (MY)

(72) Inventors: Lee Fee Ngion, Melaka (MY); Zi Song Poh, Melaka (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/499,264

(22) Filed: Sep. 29, 2014

(51) Int. Cl.
  *H01L 23/49*  (2006.01)
  *H01L 23/00*  (2006.01)
  *H01L 23/498* (2006.01)
  *H01L 23/14*  (2006.01)
  *H01L 21/78*  (2006.01)
  *H01L 21/48*  (2006.01)

(52) U.S. Cl.
  CPC ............ *H01L 24/09* (2013.01); *H01L 21/481* (2013.01); *H01L 21/4853* (2013.01); *H01L 21/4889* (2013.01); *H01L 21/78* (2013.01); *H01L 23/14* (2013.01); *H01L 23/49811* (2013.01); *H01L 23/49838* (2013.01); *H01L 2224/0905* (2013.01); *H01L 2224/0951* (2013.01)

(58) Field of Classification Search
  CPC ........ H01L 34/85; H01L 33/62; H01L 21/481; H01L 21/4853; H01L 21/4889; H01L 21/78; H01L 24/09; H01L 23/14; H01L 23/49811; H01L 23/49838; B23K 20/004
  See application file for complete search history.

(56) References Cited

U.S. PATENT DOCUMENTS

| | | |
|---|---|---|
| 5,490,040 A | 2/1996 | Gaudenzi et al. |
| 5,798,571 A | 8/1998 | Nakajima |
| 6,097,098 A | 8/2000 | Ball |
| 6,269,327 B1 | 7/2001 | Bednar et al. |
| 6,884,711 B2 | 4/2005 | Vonstaudt |
| 8,400,779 B2 | 3/2013 | Kim et al. |
| 2011/0001240 A1* | 1/2011 | Merilo et al. .......... 257/738 |

* cited by examiner

*Primary Examiner* — Whitney T Moore
(74) *Attorney, Agent, or Firm* — Charles Bergere

(57) ABSTRACT

A substrate for use in semiconductor device assembly has an electrically insulating body with a die mounting surface and an opposite grid array surface. An array of external electrical connection pads is located in the grid array surface. Substrate bond pads are located in the die mounting surface. Interconnects in the insulating body selectively interconnect the substrate bond pads to the external electrical connection pads. Tertiary bond pads are located in the die mounting surface and are electrically isolated from the external electrical connection pads.

8 Claims, 5 Drawing Sheets

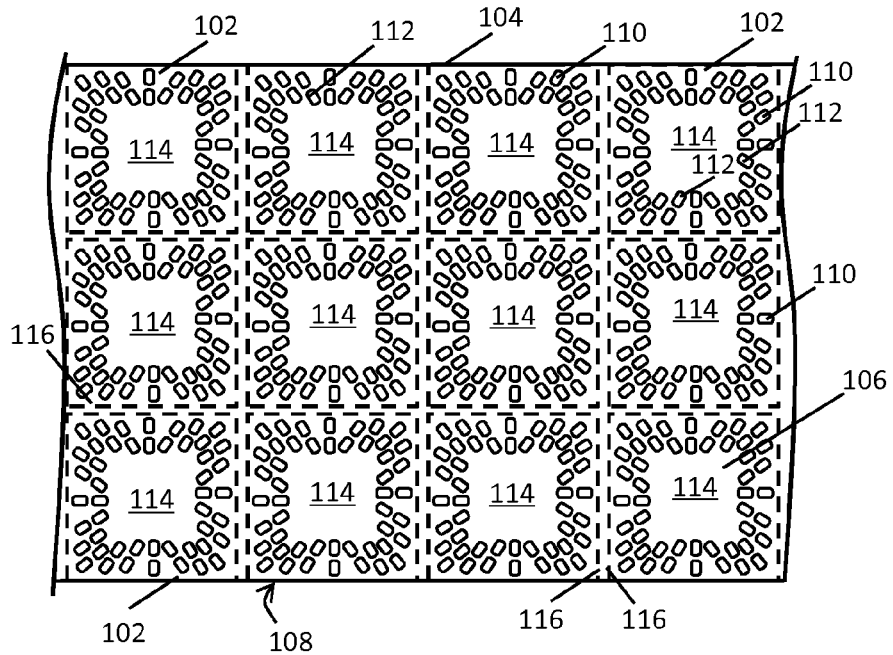
FIG. 1    100
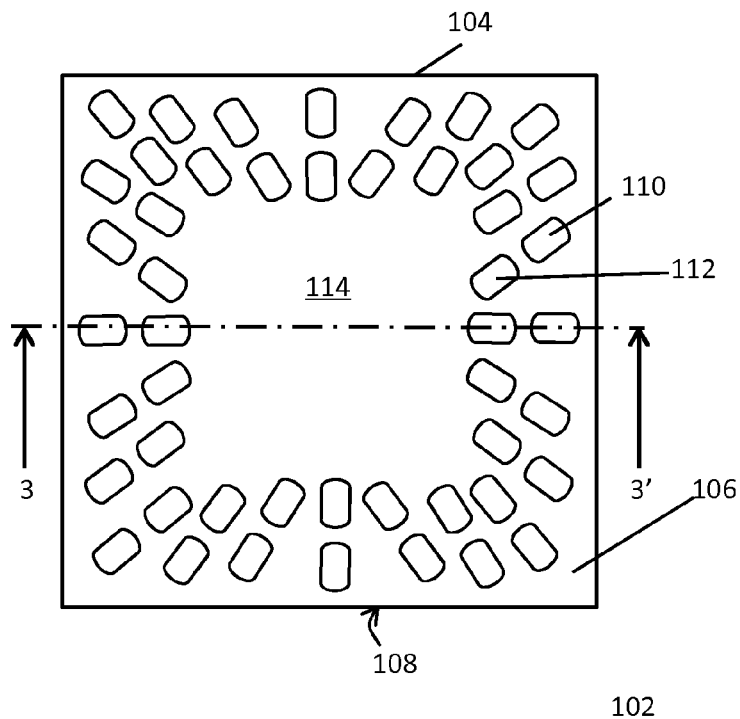
FIG. 2

SUBSTRATE WITH ELECTRICALLY ISOLATED BOND PADS

BACKGROUND OF THE INVENTION

The present invention relates generally to semiconductor packaging and, more particularly, to a die mounting substrate that has electrically isolated bond pads.

Packaged semiconductors provide external electric connections and physical protection for packaged semiconductor dies. Continued progress in reduction of the size of the semiconductor dies and increased functionality and complexity of the electronic circuits integrated in the dies requires size reduction of the packaging with the same or greater complexity of the electrical connections with external circuits.

One typical type of packaged semiconductors is Quad Flat Pack (QFP) packages, which are formed with a semiconductor die mounted to a lead frame. The lead frame is formed from a sheet of metal that comprises a die attach pad often called a flag and arms that attach the flag to a frame. Leads or lead fingers of the lead frame are electrically connected to electrodes of the die with bond wires. The leads extend outside of a package body and can be connected to external circuitry. After the electrodes and leads are connected, the semiconductor die and inner parts of the leads are encapsulated in a compound (material) such as a plastic material leaving only outer sections of the leads exposed. These exposed sections are cut from the frame of the lead frame (singulated) and bent for ease of connection to a circuit board. However, the inherent structure of QFP packages results in limiting the number of leads, and therefore the number of package external electrical connections, that can be used for a specific QFP package size. Further, the external electrical connections of the lead frame based grid array packages are typically fabricated from a thin single sheet of conductive material, such as copper or aluminium, and these connections may not be sufficiently held within the encapsulating compound (material) and may become lose.

An alternative to lead frames in the assembly of semiconductor devices is the use of circuit substrates. These substrates have internal and external bond pads that are interconnected typically by vias and runners; therefore these substrates resemble miniature Printed Circuit Boards (PCBs). Semiconductor device assembly with such substrates typically includes directly mounting a semiconductor die on the substrate and then connecting electrodes of the die to substrate bonding pads (the internal bond pads) with bond wires and then encapsulating the die and bond wires with a molding compound. The external mounting pads provide external connections as a grid array that are typically mounted to a larger circuit substrate such as a PCB or similar structure.

Semiconductor die packages are often assembled with an increased functionality and thus results in an increase in the number of required bond pads. This increase in the number of required bond pads may necessitate an increased footprint or die size, and overall package size, in order to comply with packaging rules such as: maximum and minimum allowable bond wire height; minimum bond site spacing; and maximum bend angle of a bond wire. In view of at least these packaging rules, each new semiconductor die typically has a corresponding customised substrate, which adds to the cost of the overall package. Thus, it would be advantageous to have a substrate that can accommodate various size dies and with varying numbers of electrodes/bond pads.

BRIEF DESCRIPTION OF THE DRAWINGS

The invention, together with objects and advantages thereof, may best be understood by reference to the following description of preferred embodiments together with the accompanying drawings in which:

FIG. 1 is a top plan view of a sheet comprising an array of mounting substrates according to an embodiment of the present invention;

FIG. 2 is an enlarged plan view of one of the mounting substrates of FIG. 1, according to an embodiment of the present invention;

DETAILED DESCRIPTION OF PREFERRED EMBODIMENTS

Figure 3:
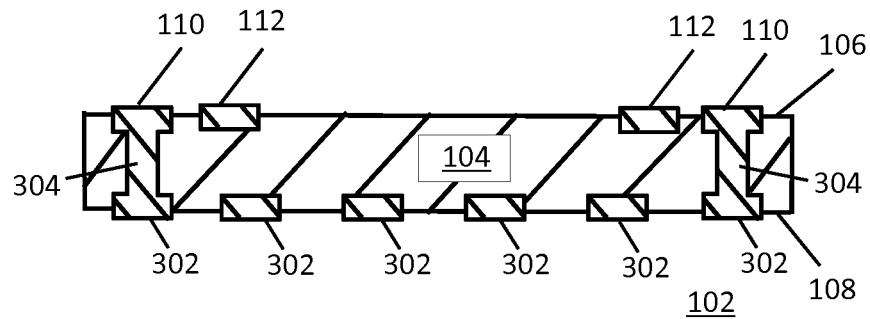
FIG. 3 is an enlarged cross-sectional side view, through 3-3', of one of the mounting substrates of FIG. 2, according to an embodiment of the invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a mounting substrate for a semiconductor die. The substrate includes an electrically insulating body with a die mounting surface and an opposite grid array surface. An array of external electrical connection pads is located in the grid array surface, and substrate bond pads are located in the die mounting surface. Interconnects are provided in the insulating body to selectively connect the substrate bond pads to the external electrical connection pads. Tertiary bond pads are located in the die mounting surface. The tertiary bond pads are electrically isolated from the external electrical connection pads.

In another embodiment, the present invention provides a semiconductor die package that comprises an electrically insulating body with a die mounting surface and an opposite grid array surface. An array of external electrical connection pads is located in the grid array surface, and substrate bond pads are located in the die mounting surface. There are interconnects in the insulating body that selectively connect the substrate bond pads to the external electrical connection pads. Tertiary bond pads are located in the die mounting surface. The tertiary bond pads are electrically isolated from the external electrical connection pads. A semiconductor die is mounted on the die mounting surface and bond wires selectively connect electrodes of the semiconductor die to the tertiary bond pads.

In another embodiment, the present invention provides a method of assembling a semiconductor device. The method includes providing a sheet having an array of mounting substrates. Each of the mounting substrates comprises an electrically insulating body with a die mounting surface and an opposite grid array surface. An array of external electrical connection pads is located in the grid array surface, and substrate bond pads are located in the die mounting surface. There are interconnects in the insulating body that selectively connect the substrate bond pads to the external electrical connection pads. Tertiary bond pads are located in the die mounting surface. The tertiary bond pads are electrically isolated from the external electrical connection pads. The method also includes mounting semiconductor dies onto a die mounting region of each of the mounting substrates and selectively electrically connecting electrodes of the semiconductor dies to the tertiary bond pads with bond wires. The method also includes encapsulating the semiconductor dies and separating the mounting substrates from the sheet to provide the semiconductor devices.

Referring now to FIG. 1, a top plan view of a sheet 100 comprising an array of mounting substrates 102, according to an embodiment of the invention, is shown. Each of the mounting substrates 102 is suitable for receiving and supporting a semiconductor die. Also, each of the mounting substrates 102 includes an electrically insulating body 104 with a die mounting surface 106 and an opposite grid array surface 108. There are substrate bond pads 110 and tertiary bond pads 112 both being located in the die mounting surface 106. Each mounting substrate 102 has a pad free central area on the die mounting surface 106 that defines, and provides, a die mounting region 114. Also shown are dotted lines identifying singulation guides (saw streets) or boundaries 116 of each mounting substrate 102.

FIG. 2 is an enlarged plan view of one of the mounting substrates 102, according to an embodiment of the invention. In this embodiment the substrate bond pads 110 form an outer set of pads that surround and are distal from the die mounting region 114, whereas the tertiary bond pads 112 form an inner set of pads that surround and are proximal to the die mounting region 114. Also, in this embodiment the number tertiary bond pads 112 is equal to the number of substrate bond pads 110. However in other embodiments there may be more tertiary bond pads 112 than substrate bond pads 110. In yet another embodiment there may be more substrate bond pads 110 than tertiary bond pads 112.

Referring now to FIG. 3, an enlarged cross-sectional side view, through 3-3' of one of the mounting substrates 102, according to an embodiment of the invention, is shown. The mounting substrate 102 has an array of external electrical connection pads 302 located in the grid array surface 108. There are also interconnects 304 in the insulating body 104. The interconnects 304 provide for selectively interconnecting the substrate bond pads 110 to the external electrical connection pads 302. As will be apparent to a person skilled in the art, the interconnects 304 are typically upright conductive vias and combinations of upright conductive runners and vias. As illustrated, the tertiary bond pads 112 are electrically isolated from the external electrical connection pads 302 and thus form electrically isolated bond pads on the die mounting surface 106.

Figure 4:
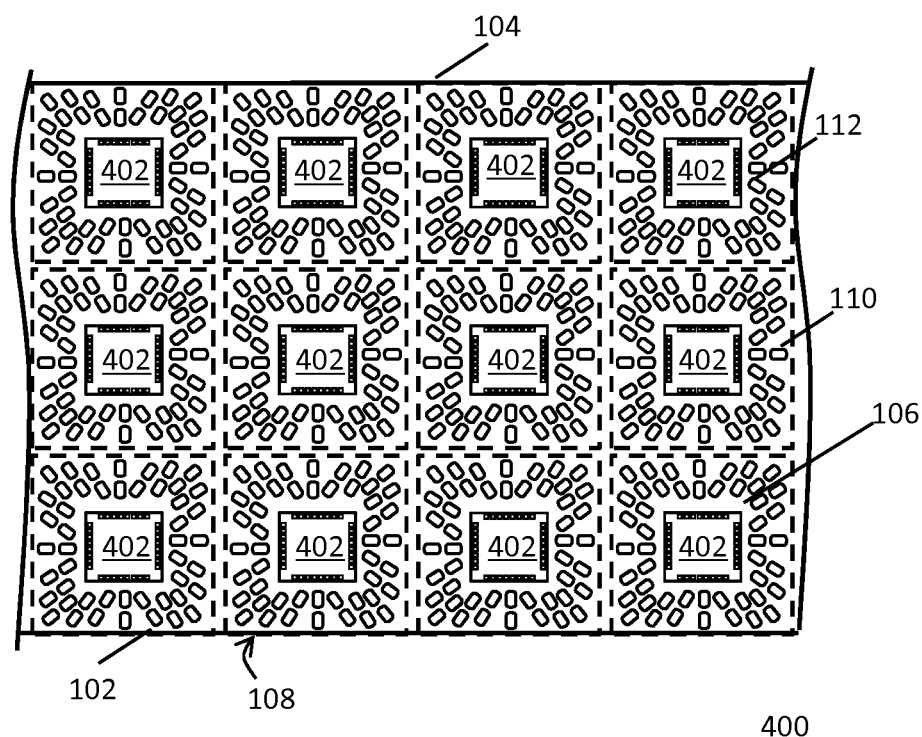
FIG. 4 is a top plan view of a populated sheet, formed from the sheet of FIG. 1, according to an embodiment of the invention.

Referring to FIG. 4, there is illustrated a plan view of a populated sheet 400, formed from the sheet 100, according to an embodiment of the invention. The populated sheet 400 includes semiconductor dies 402, each of which are mounted on the die mounting surface 106 at a respective die mounting region 114.

Figure 5:
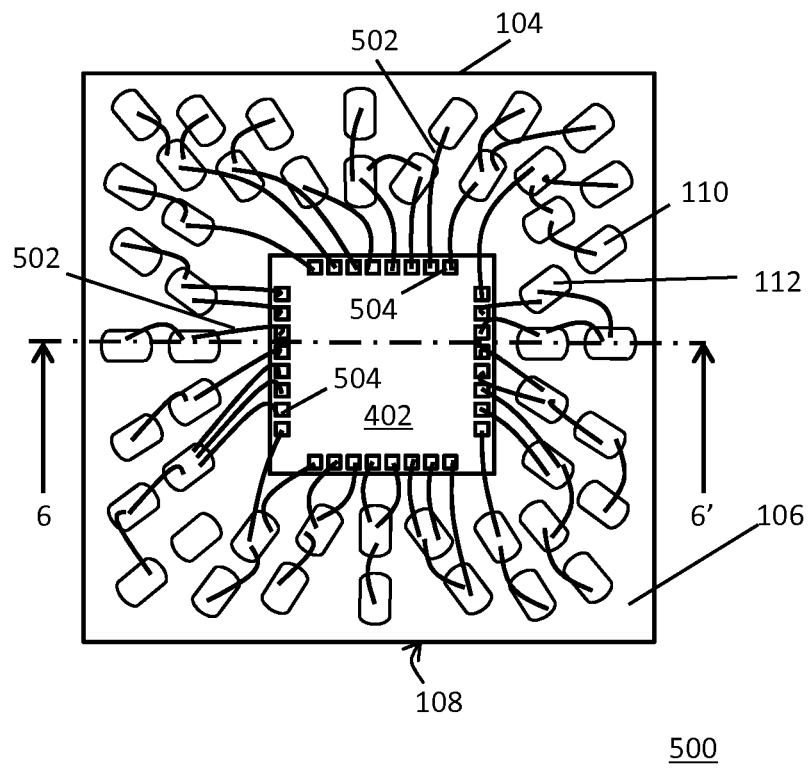
FIG. 5 is an enlarged plan view of one assembly formed on the populated sheet of FIG. 4, according to an embodiment of the invention.

In FIG. 5, there is illustrated an enlarged plan view of one assembly 500 formed on the populated sheet 400, according to an embodiment of the invention. The assembly includes bond wires 502 selectively connecting electrodes 504 of the semiconductor die 402 to the tertiary bond pads 112. The bond wires 502 also selectively connect the substrate bond pads 110 to the tertiary bond pads 112. Also, at least some of the bond wires 502 selectively connect the substrate bond pads 110 directly to the electrodes 504 of the semiconductor die 402. In addition, as shown, the bond wires 502 can selectively connect more than one of the electrodes 504 to one of the tertiary bond pads 112 and any also interconnect two or more of the tertiary bond pads 112 together. Also, in this embodiment the bond wires 502 selectively connect one of tertiary bond pads 112 to at least two the substrate bond pads 110.

Figure 6:
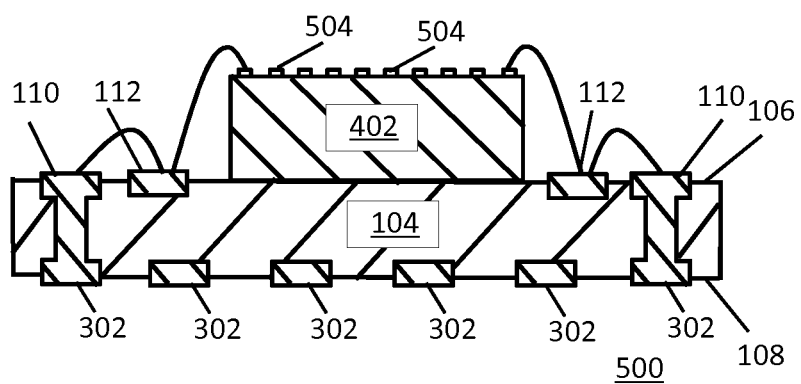
FIG. 6 is an enlarged cross-sectional side view, through 6-6', of the assembly of FIG. 5, according to an embodiment of the invention.

Referring now to FIG. 6, there is illustrated an enlarged cross-sectional side view, through 6-6' of the assembly 500, according to an embodiment of the invention. This view shows the bond wires 502 interconnecting the electrodes 504 to the substrate bond pads 110 via the tertiary bond pads 112.

Figure 7:
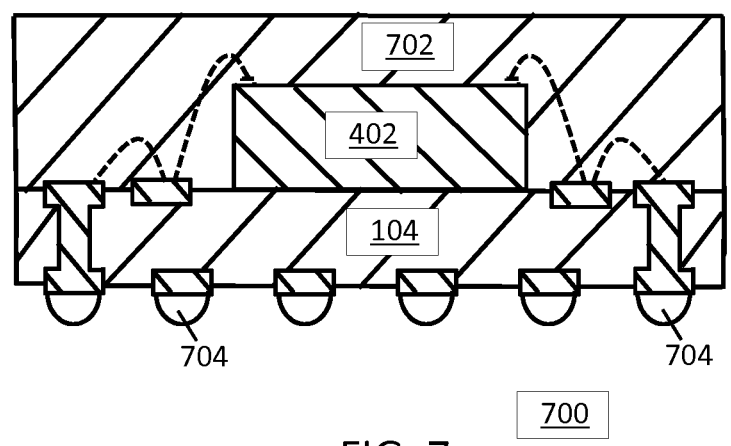
FIG. 7 is a cross-sectional side view of a semiconductor device formed from the assembly of FIG. 5, according to an embodiment of the invention.

FIG. 7 is a cross-sectional side view of a semiconductor die package 700 formed from the assembly 500, according to an embodiment of the invention. The semiconductor die package 700 has been encapsulated so that the bond wires 502, semiconductor die 402, tertiary bond pads 112 and substrate bond pads 110 are covered in an encapsulating compound 702. Solder deposits (solder balls) 704 have been reflowed (attached) onto the external electrical connection pads 302 so that the semiconductor die package 700 is a ball grid array. The semiconductor die package 700 has been cut (separated) from the sheet 100, by a sawing process, along the singulation guides 116.

Figure 8:
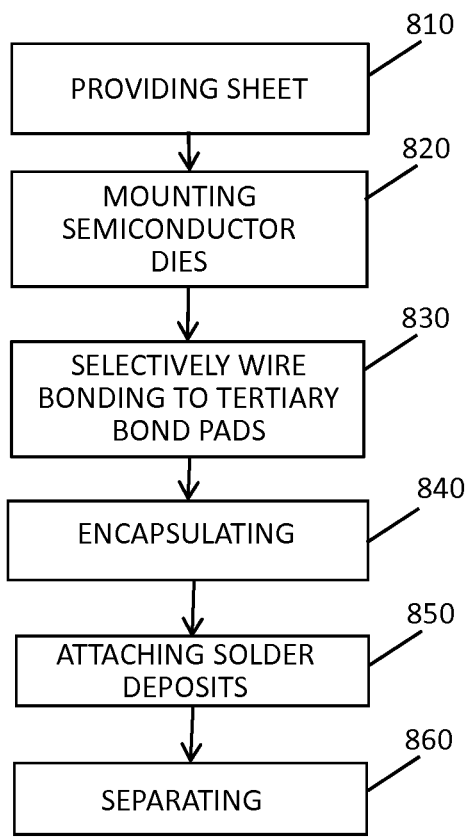
FIG. 8 is a flow chart illustrating a method of assembling semiconductor devices according to an embodiment of the invention.

FIG. 8 is a flow chart illustrating a method 800 of manufacturing semiconductor die packages 700, according to an embodiment of the invention. The method 800 includes, at a block 810, providing the sheet 100 comprising the array of mounting substrates 102. The method 80 then performs, at a block 820, a process of mounting the semiconductor dies 402 onto the die mounting region 114 of each of the mounting substrates 102 to provide the populated sheet 400. There is then performed, at a block 830, a wire bonding process that selectively wire bonds electrodes 504 of the semiconductor dies to the tertiary bond pads 112, the substrate bond pads 110 to the tertiary bond pads 112 and the substrate bond pads 110 directly to the electrodes 504 of the semiconductor dies 402. In some embodiments there is also performed selectively connecting two or more of the tertiary bond pads 112 together and/or selectively connecting one of tertiary bond pads 112 to at least two the substrate bond pads 110. At a block 840, there is performed a molding process for encapsulating the semiconductor dies 404 with the mold compound 702. At a block 850 the solder deposits 704 are attached to the external electrical connection pads 302 by a solder reflowing process. Next, at a block 860 there is performed a process of separating each the mounting substrates 102 from the sheet 100, by the sawing process along the singulation guides 116, to provide the semiconductor die packages 700.

Advantageously, the present invention at least alleviates the need for customised substrates for new semiconductor dies. This is because the tertiary bond pads allows for flexibility of bond wire routing thus allowing for ease of compliance with packaging rules without necessarily requiring a customised substrate.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A semiconductor device, comprising:
    an electrically insulating substrate with a die mounting surface and an opposite grid array surface;
    an array of external electrical connection pads located in the grid array surface;
    substrate bond pads located in the die mounting surface;
    interconnects in the insulating body selectively connecting the substrate bond pads to the external electrical connection pads;
    tertiary bond pads located in the die mounting surface, wherein the tertiary bond pads are electrically isolated from the external electrical connection pads;
    a semiconductor die mounted on the die mounting surface of the substrate;
    first bond wires selectively connecting electrodes of the semiconductor die to the tertiary bond pads;
    second bond wires that selectively connect the substrate bond pads to the tertiary bond pads, wherein first selected ones of the second bond wires selectively connect one of the tertiary bond pads to at least two of the substrate bond pads.

2. The semiconductor device of claim 1, wherein second selected ones of the second bond wires selectively connect the substrate bond pads directly to the semiconductor die electrodes.

3. The semiconductor device of claim 1, further comprising third bond wires that selectively connect two or more tertiary bond pads together.

4. The semiconductor device of claim 1, wherein the semiconductor die is mounted on a pad free central area of the die mounting surface that provides a die mounting region.

5. The semiconductor device of claim 4, wherein the substrate bond pads form an outer set of pads that surround and are distal from the semiconductor die.

6. The semiconductor device of claim 5, wherein the tertiary bond pads form an inner set of pads that surround and are proximal to the semiconductor die.

7. The semiconductor device of claim 6, wherein the number of tertiary bond pads is equal to the number of substrate bond pads.

8. A semiconductor device, comprising:
    an electrically insulating substrate with a die mounting surface and an opposite grid array surface;
    an array of external electrical connection pads located in the grid array surface;
    substrate bond pads located in the die mounting surface;
    interconnects in the insulating body selectively connecting the substrate bond pads to the external electrical connection pads;
    tertiary bond pads located in the die mounting surface, wherein the tertiary bond pads are electrically isolated from the external electrical connection pads;
    a semiconductor die mounted on the die mounting surface of the substrate;
    first bond wires selectively connecting electrodes of the semiconductor die to the tertiary bond pads;
    second bond wires that selectively connect the substrate bond pads to the tertiary bond pads; and
    third bond wires that selectively connect two or more tertiary bond pads together.

* * * * *